July 19, 1966 S. T. ENG 3,262,029

LOW NOISE MICROWAVE DIODE

Filed July 24, 1962 2 Sheets-Sheet 1

INVENTOR.
SVERRE T. ENG,
BY
W H MacAllister Jr
ATTORNEY

United States Patent Office 3,262,029
Patented July 19, 1966

3,262,029
LOW NOISE MICROWAVE DIODE
Sverre T. Eng, Tustin, Calif., assignor to Hughes Aircraft Company, Culver City, Calif., a corporation of Delaware
Filed July 24, 1962, Ser. No. 212,101
3 Claims. (Cl. 317—234)

This invention relates to high frequency semi-conductor devices and particularly, but not necessarily exclusively, to those employed to mix electromagnetic energy of microwave frequencies to produce an intermediate frequency signal in the audio range.

In certain navigational systems such as Doppler radar systems, transmitted and reflected microwave signals are mixed to produce an intermediate frequency signal representative of the Doppler "beat" or difference. This intermediate frequency signal is in the audio range and is extremely subject to interference from electrical diode noise, particularly noise hereinafter described in greater detail as "$l/f$ noise." While such noise may be substantially reduced or avoided by utilization of a higher IF signal level (i.e., 30 mc.), the complexity of such higher intermediate frequency systems increases and results in a sacrifice of light weight and small size. It will be appreciated that the interference from such noise in Doppler radar systems is a critical factor and can render the system useless or excessively inaccurate. While theoretically the lowest possible $l/f$ noise might be attained with a P-N junction diode, the conversion loss of such diodes, particularly for frequency mixing purposes at microwave frequencies, is excessive; that is, a signal power loss of greater than 15 db is characteristic of junction diodes previously investigated. The high conversion loss of junction diodes is known to be principally due to the junction capacitance which could not heretofore be successfully minimized to an acceptable value. The high junction capacitance is caused by or at least severely aggravated by the necessity of employing low resistivity semiconductor material which is necessary for the operation at microwave frequencies.

In explaining the solution to the problem of providing a low noise mixer diode having an acceptable conversion loss, it will be helpful to review briefly the noise characteristics of semiconductor devices. In general there are three basic types of noise which occur in semiconductor devices. The first is "thermal" noise caused by the random motion of electrons. The second noise type is "shot" noise which results when a drift velocity is superimposed by means of an electric field. The third noise type, which is by far the most troublesome to control since its origin is not precisely known, is "$l/f$ noise" which is detected over and above both thermal and shot noise and which is distinguished by its spectral intensity. Experiments and investigations by others have indicated that the degree of electrical activity of the surface of the semiconductor body itself plays a significant part in connection with $l/f$ noise. Hence one approach for decreasing this noise has been to stabilize the surface by such procedures as etching the surface, controlling the ambient gas thereabout, and by providing thermally grown oxide layers.

The present invention is based at least in part upon the fact that degenerate or nearly degenerate N-type germanium has been found to be inherently capable of providing a diode capable of operating at microwave frequency having the lowest attainable $l/f$ noise figure and that a similarly degenerate P-type region can be provided in such N-type body of germanium with an acceptably low junction capacitance. By "degenerate" is meant a semiconductor material which has an extremely low specific resistivity (i.e., less than 0.004 ohm-centimeter) so that the semiconductor is almost a conductor at least in one direction of current flow therethrough. By the present invention a diode having a $l/f$ noise figure of less than 20 db and a conversion loss of less than 10 db can be achieved at 13.5 kmc. input frequency and a 1 kc. intermediate frequency. These characteristics represent a substantial advance over the diodes heretofore employed.

In addition to the improvement resulting from the utilization of degenerate N-type and P-type germanium and the provision of an extremely low junction capacitance, the diode of the present invention also achieves its excellent characteristics according to the invention by the attainment of an extremely good electrical connection between the P-type region of the diode and the lead wire therefor. This gives a volt-ampere characteristic with lower reverse current and a higher forward resistive nonlinearity than conventional point contact diodes employed heretofore for microwave frequency mixing purposes.

The invention will be described in greater detail by reference to the drawings in which.

Figure 1:
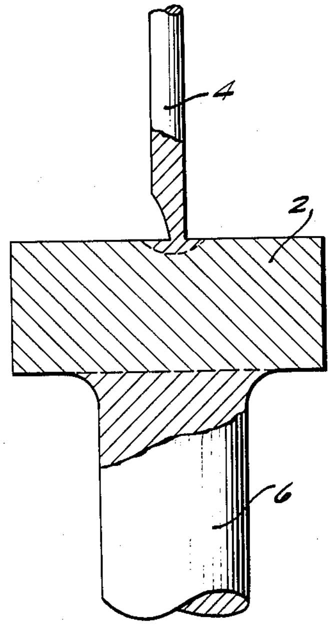
FIGURE 1 is an elevational view in section of a microwave diode in accordance with the invention.

Referring now to the drawings, a microwave mixer diode according to the invention is shown comprising an N-type germanium wafer 2, preferably single crystalline an acceptor-doped electrode 4 bonded to and in rectifying relationship with the wafer, and a non-rectifying electrode 6 connected to a different portion of the wafer.

The N-type wafer 2 is provided by slicing and dicing an ingot in single crystalline form of germanium which has been doped by conventional techniques with a donor or N-type impurity such as arsenic. In order to enhance operation of the device at microwave frequencies, the resistivity of the N-type germanium wafer 2 should be between 0.001 and 0.004 ohm-centimeter.

The whisker or electrode 4 consists essentially of a gallium-plated gold wire. The electrode 4 is bonded to the N-type germanium wafer by an electrical pulsing technique which will be described in greater detail hereinafter. By this pulsing technique a regrown region 26 of P-type conductivity is provided in the wafer 2 which regrown region is relatively heavily doped so that the resistivity thereof is equivalent or nearly so to that of the bulk of the wafer 2. Hence, the P-type region 26 is likewise of degenerate or nearly degenerate semiconductor material.

The electrode 6 may be a wire of any good electrically conductive material which can be soldered or otherwise secured to the germanium wafer 2 so as to provide a non-rectifying connection thereto. Thus, the electrode 6 may be a wire or brass pin, for example, which is soldered to the wafer 2 by a tin-antimony solder to insure the attainment of a non-rectifying connection. In some instances it may be desirable to utilize a solder preform to make this ohmic connection, the preform comprising a plating of tin or tin-antimony alloy.

Figure 3:
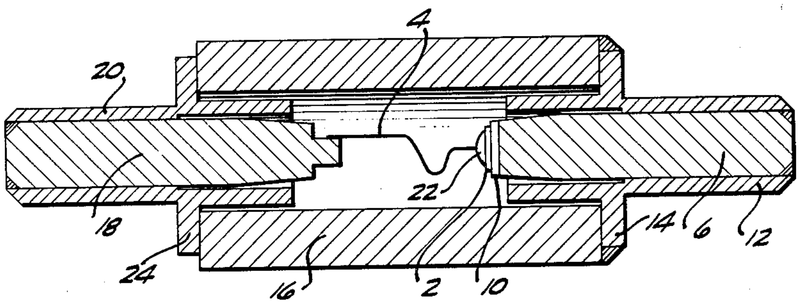
FIGURE 3 is an elevational view, partly in section, of a microwave diode in accordance with the invention and the container therefor.

Referring now to FIGURE 3, the germanium wafer 2 is shown connected to a stud type lead member 6. In particular the wafer 2 may be soldered to the stud member 6 by means of a preform 10 comprising a 6 mil molybdenum substrate having a first plating of tin thereon (about 1 mil thick), and a second plating or flashing of antimony over the tin (about 0.2 mil thick). The stud member 6 is contained within a metallic tube 12 and is hermetically soldered or bonded thereto. The metallic tube 12, which may be of gold-plated brass, for example, is provided with a collar or flange portion 14 adapted to engage the ends of a ceramic sleeve 16 and to be hermetically sealed thereto so that the crystal wafer 2 and the end of the stud member 6 on which the crystal wafer is mounted are contained within the space defined by the ceramic sleeve 16. The sealing of the collar portion 14 to the ceramic body may be accomplished by conventional techniques for bonding metallic bodies to ceramic articles. In general, this technique involves the metallization of the ends of the ceramic sleeve 16 with a mixture of molybdenum and manganese so as to provide a metalized surface to which a bond by brazing or soldering may be readily achieved. In some instances it may be desirable to plate the metalized portions of the ceramic sleeve 16 with nickel so as to facilitate the use of solder for the hermetic sealing thereto.

Disposed in the opposite end of the ceramic sleeve 16 is a similar type stud member 18 and flanged metallic tube 20 which is adapted to be hermetically sealed to the end of the ceramic sleeve in the manner just described. The end of the stud member 18 which extends into the interior of the ceramic sleeve 16 has a reduced diameter portion to which is welded the gold gallium whisker 4.

In assembly, the crystal 2 is mounted onto the stud member 6. A small drop of epoxy resin may then be applied to the surface of the crystal 2 in accordance with the teachings of the co-pending patent application of W. P. Waters and R. R. August, entitled "Semiconductor Device and Methods Therefor," Serial No. 142,346 filed October 2, 1961, now abandoned. The crystal-carrying stud member 6 and the whisker-carrying stud member 18 are then inserted into the flanged tubular members 12 and 20, respectively, the whisker 4 making contact with the crystal 2 through the epoxy resin material 22.

Figure 4:
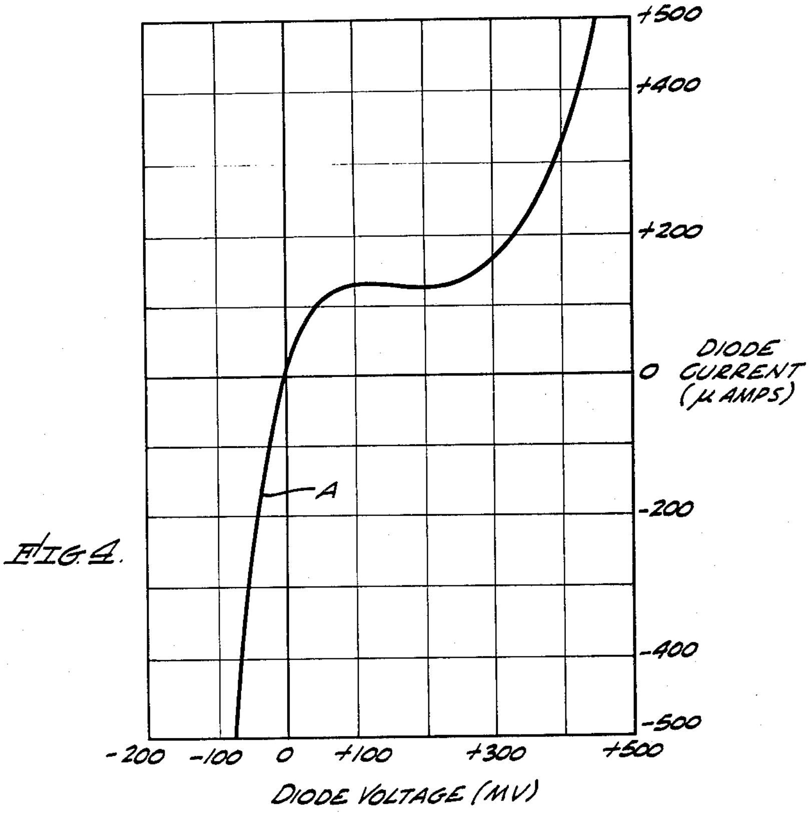
FIGURE 4 is a graph illustrating the current-voltage (I–V) characteristic of the diode according to the present invention.

Thereafter pulses in the range of 1 to 20 volts and of millisecond duration are applied one at a time until a voltage-amperage characteristic corresponding to that shown by curve A in FIGURE 4 is obtained. As is well-known, the voltage-amperage characteristic is displayed on an oscilloscope during pulsing where it may be observed. The final step in the operation is to solder the stud members 6 and 18, respectively, to the tubular members 12 and 20 and to solder the flanged portions 14 and 24 of the stud members to the ceramic envelope 16.

Figure 2:
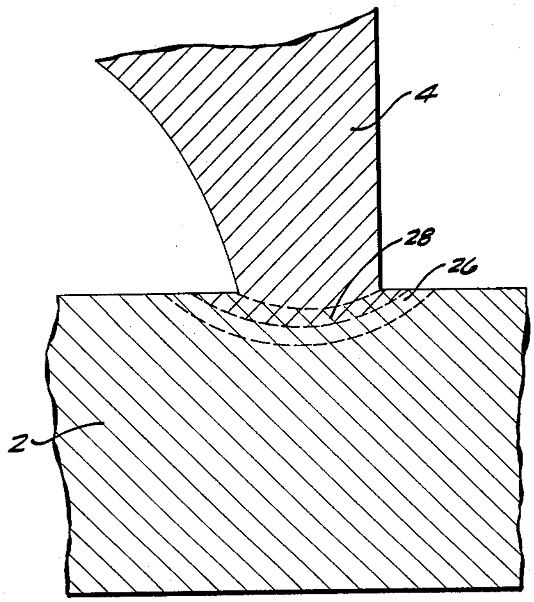
FIGURE 2 is a cross-sectional elevational view of the lead wire and junction region of the diode shown in FIGURE 1.

With particular reference to FIGURES 1 and 2, this pulsing procedure achieves a fusion of the whisker 4 to surface and near surface portions of the germanium wafer 2. By pulsing, sufficient heat is generated at the contact region between the whisker 4 and the wafer 2 to result in the momentary formation of a liquid alloy phase of the materials of the whisker and the germanium crystal. Upon the termination of the pulsing, the temperature decreases and the liquid solution solidifies to form a gallium-doped P-type region 26 in rectifying relationship with the N-type germanium crystal body, and a germanium-gold eutectic region 28 which is fused to and ohmically connected to the P-type region 26 and the unmelted tip of the whisker 4. The P-type region 26 is a regrowth region, that is, it is a single crystalline extension or continuation of the crystal structure of the germanium body 2. By this method a heavily doped rectifying contact to the wafer 2 is provided having a capacitance less than 0.2 micromicrofarads with a volt-ampere characteristic as shown in FIGURE 4. By obtaining such a small junction and contact capacitance to the relatively low resistivity germanium body, the conversion loss of the diode thus produced is less than 10 db at 13.5 kmc. input frequency and 1 kc. intermediate frequency.

Referring now to FIGURE 4, curve A represents the voltage-current characteristic of a diode manufactured according to the present invention as shown. It will be noted that the reverse and forward characteristics of the present diode resemble the forward and back characteristics, respectively, of conventional alloy junction diodes. Because the diode exhibits such characteristics which appear to be "backward" in comparison with conventional diodes, the diode of the present invention is often called a "backward" diode. It will be further understood that one of the significant features of the present diode is that it exhibits a "tunneling" characteristic in the reverse direction only. The phenomenon of tunneling is well known in the art and further detailed description thereof herein is not deemed necessary. This phenomenon and the characteristics of the present invention are described in more detail in an article by the present inventor in IRE Transactions on Microwave Theory and Techniques (vol. MTT-9, No. 5, September 1961). Due to tunneling phenomena in the reverse direction, the current increases extremely rapidly for voltages of less than about −0.1 volt. As the reverse bias is increased, the supply of electrons which are able to tunnel increases without limit; at zero bias no current flows through the junction; and at forward bias only a very small current is able to flow by the tunneling process. The excess current is, in some cases, fairly constant until carrier injection takes place giving rise to the normal forward characteristic of a P-N junction.

Figure 5:
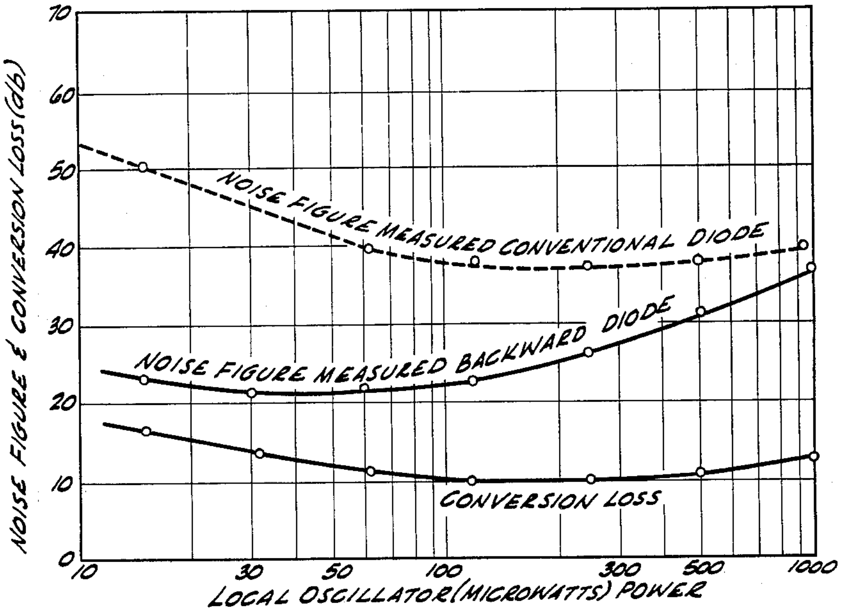
FIGURE 5 is a graph comparing typical $l/f$ noise figures at different local oscillator powers for mixer diodes of the prior art and for the mixer diode according to the present invention.

The backward diode of the present invention has several important uses among which is Doppler radar systems as a mixer with IF in the audio range. In FIGURE 5 the performance characteristics of a backward diode mixer with 990-c.p.s. IF are plotted. The noise figure of a commercially available, allegedly "low" $l/f$ noise diode (IN1838) is also shown for comparison. First of all, it is indicated that the backward diode has a considerably lower noise figure which is caused by a reduction of $l/f$ noise. Another important consideration is that the diode is capable of operating with very low local oscillator powers without any D.C. bias. The reason is that the nonlinear region of the I-V characteristic is in the vicinity of the origin, while in ordinary mixer diodes the nonlinearity occurs around the contact voltage, which may be 0.3 to 0.6 volt in the forward direction. Thus, the backward diode may be used in a low-noise mixer using a tunnel diode or variable-capacitance diode harmonic generator as the local oscillator.

A more direct comparison of the two diodes is made in the following table. In this table and in Table II, below, the abbreviations used have the following meanings:

$R_s$=bulk series resistance
$C_t$=junction (transition) capacitance
$F_{op}$=noise figure
$L_m$=conversion loss
$t_m$=noise temperature
LOP=local oscillator power TABLE I.—COMPARISON OF MIXER CHARACTERISTICS
[RF=13.5 kmc., IF=990 c.p.s.]

| Diode | $R_s$ (ohm) | $C_t$ ($\mu\mu$f.) | LOP=30 Microwatts | | | LOP=250 Microwatts | | |
|---|---|---|---|---|---|---|---|---|
| | | | $F_{op}$ (db) | $L_m$ (db) | $t_m$ (db) | $F_{op}$ (db) | $L_m$ (db) | $t_m$ (db) |
| BD No.5 | 10 | 0.3 | 21.5 | 14 | 9.8 | 27.5 | 10.0 | 21 |
| Prior Art | 12 | 0.1 | 45.5 | 19.5 | 25 | 37.5 | 8 | 31.5 |

It can be concluded that one of the real improvements in the noise figure obtained by the backward diode compared with that of a conventional mixer diode is caused by the reduction in noise temperature. Also, $l/f$ noise is less pronounced in the backward diode since it is made of lower resistivity material than prior art mixer diodes, and that $l/f$ noise is lower at the optimum noise figure because less local oscillator power (and thus rectified diode current) is needed for satisfactory operating performance.

In optimum receiver design it has been found that 30 mc. is a good choice for the intermediate frequency using present commercially available mixer diodes. This optimum IF is mainly determined by the noise figure of the IF amplifier and the mixer noise temperature. The reduction of $l/f$ noise in mixer diodes therefore permits more freedom in receiver design.

At 30 mc. the main contribution to the noise temperature is shot and thermal noise. However, in some cases a very small excess noise contribution may be present. Nevertheless, since the backward diode is made of lower resistivity material than conventional mixer diodes, an improvement in the noise temperature is obtained since the thermal noise caused by the series-bulk resistance is reduced.

In Table II the comparison is made between another prior art diode (the IN23WE) and the backward diode at 300-$\mu$w. local oscillator power, which seems to give the best noise figure for both diode types, and at 30-$\mu$w. (which may be of interest in lightweight systems since this small amount of power may be readily available from tunnel-diode oscillators or harmonic generators using variable-capacitance diodes).

TABLE II.—COMPARISON OF MIXER CHARACTERISTICS
[RF=13.5 kmc., IF=30 mc.]

| Diode | $R_s$ (ohm) | $C_t$ ($\mu\mu$f.) | LOP=30 Microwatts | | | LOP=300 Microwatts | | |
|---|---|---|---|---|---|---|---|---|
| | | | $F_{op}$ (db) | $L_m$ (db) | $t_m$ (ratio) | $F_{op}$ (db) | $L_m$ (db) | $t_m$ (ratio) |
| BD No. 2 | 8 | 0.6 | 14.1 | 12.3 | 1 | 11.1 | 8.8 | 1.12 |
| Prior Art | 35 | 0.2 | 20 | 18 | 1.08 | 10.8 | 8 | 1.46 |

At higher local oscillator powers, the backward diode has a noise figure comparable to that of the prior art diode; however, at lower local oscillator powers, the backward diode has a much better noise figure than the prior art diode. The main reason for this is that the prior art diode, a 1N23WE, does not have the same ability to rectify small powers as the backward diodes. Thus, the conversion loss will be substantially higher in the 1N23WE diode at low local oscillator powers.

Another major application of the backward diode is in video detection. In a crystal video receiver, for example, the incoming modulated RF signal is detected immediately at the input from the antenna, and the resulting video signal is amplified by a highgain video amplifier. The advantages of this type of receiver are simplicity, small size, low cost and broad RF bandwidth. The price paid for these attractive features is a large loss of sensitivity compared with that obtainable with a superheterodyne receiver. However, there are applications where the lower sensitivity is acceptable and where the small size or broad band is required (beacon radar receivers and square-law detectors in power measurement instruments, for example). In such applications the backward diodes are more advantageous than those used heretofore. The higher current sensitivity is partly due to the lower video impedance ($R_b$) compared with that of the prior art diode MA408B, to a lower product of $R_s$ $C_t$, and to a higher I–V nonlinearity.

The video detector characteristics of two prior art diodes (MA408B) and two backward diodes according to the present invention are compared in Table III where the abbreviations used have the following meanings:

$R_b$=video impedance
$B$=current sensitivity
$M$=figure of merit

TABLE III.—COMPARISON OF VIDEO DETECTOR CHARACTERISTICS

| Diode | $R_s$ (ohm) | $C_t$ ($\mu\mu$f.) | $R_b$ (ohm) | 13.5 kmc. | | 6 kmc. | |
|---|---|---|---|---|---|---|---|
| | | | | B at 1 $\mu$w. power | M, calculated | B at 1 $\mu$w. power | M, calculated |
| Prior Art Diode #1 | 42 | 0.23 | 35K | 0.2 | 37 | 2 | 370 |
| Prior Art Diode #2 | 32 | 0.32 | 20K | 0.2 | 28 | 2 | 280 |
| Backward Diode #1 | 10 | 0.3 | 730 | 2.7 | 45 | 11 | 180 |
| Backward Diode #2 | 8 | 0.5 | 880 | 2.4 | 47 | 7.5 | 145 |

Additional advantages of the backward detector diodes over conventional detector diodes may be the expected smaller variations in the performance characteristics with variations in temperature and nuclear radiation.

There thus has been described a diode capable of operation at mocrowave frequencies at much lower noise figure than heretofore obtainable. In addition, the present diode can be operated with an order of magnitude lower local oscillator power than prior art mixer diodes. Since the backward diode is virtually independent of the lifetime of minority carriers or of the surface treatment, a larger dose of nuclear radiation can be tolerated than conventional mixer diodes. The tunneling portion of the I–V curve is also substantially independent of temperature.

What is claimed is:

1. A microwave frequency semiconductor device having a tunneling characteristic substantially in the reverse direction only and comprising a body of degenerate N-type germanium having a resistivity of between 0.001 and 0.004 ohm-centimeter, and a lead of acceptor material bonded to said germanium body and forming thereat a P-type region in said body, the capacitance between said lead and said N-type germanium body extending up to and including about 0.20 micromicrofarads, and a non-rectifying connection to another portion of said germanium body.

2. A microwave frequency semiconductor device comprising an envelope, a pair of lead members coaxially disposed in the opposite ends of said envelope, a body of degenerate N-type germanium having a resistivity of between 0.001 and 0.004 ohm-centimeter mounted within said envelope to one of said lead members and in non-rectifying relationship therewith, a lead containing gold and gallium secured to the other of said lead members and bonded to and in rectifying relationship with said germanium body, the capacitance between said lead and said germanium body extending up to and including about 0.20 micromicrofarads.

3. A microwave frequency semiconductor device comprising an envelope, a pair of lead members coaxially disposed in opposite ends of said envelope, a body of degenerate N-type germanium having a resistivity of between 0.001 and 0.004 ohm-centimeter mounted within said envelope on one of said lead members and in non-rectifying relationship therewith, a lead containing gold and gallium secured to the other of said lead members and bonded to said germanium body and forming thereat and therein a P-type region, the capacitance between said lead and said N-type germanium body extending up to and including about 0.20 micromicrofarads.

References Cited by the Examiner

UNITED STATES PATENTS

| | | | |
|---|---|---|---|
| 2,843,765 | 7/1958 | Aigrain | 307—88.5 |
| 3,001,112 | 9/1961 | Murad | 317—235 |
| 3,027,501 | 3/1962 | Pearson | 317—234 |

OTHER REFERENCES

D. I. Breitzer, "Noise Figure of Tunnel Diode Mixer," Proc. IRE, vol. 48, pages 935–6, May 1960.

JOHN W. HUCKERT, *Primary Examiner.*

DAVID J. GALVIN, *Examiner.*

J. A. ATKINS, J. D. KALLAM, *Assistant Examiners.*